US006670097B2

(12) United States Patent
Denzinger et al.

(10) Patent No.: US 6,670,097 B2
(45) Date of Patent: Dec. 30, 2003

(54) PRESENSITIZED PRINTING PLATE WITH PIGMENTED BACK COATING

(75) Inventors: Steffen Denzinger, Mainz (DE); Michael Dörr, Mainz (DE); Andreas Elsässer, Idstein (DE); Günther Hultzsch, Wiesbaden (DE); Peter Lehmann, Kelheim (DE)

(73) Assignee: Agfa-Gevaert (BE)

( * ) Notice: Subject to any disclaimer, the term of this patent is extended or adjusted under 35 U.S.C. 154(b) by 145 days.

(21) Appl. No.: 09/884,708

(22) Filed: Jun. 19, 2001

(65) Prior Publication Data

US 2002/0012877 A1 Jan. 31, 2002

(30) Foreign Application Priority Data

Jun. 19, 2000 (DE) ........................................ 100 29 157

(51) Int. Cl.[7] .............................. G03F 7/09; G03C 1/77

(52) U.S. Cl. ................................ 430/272.1; 430/276.1; 430/56; 430/496; 430/950; 430/271.1; 430/531

(58) Field of Search ........................... 430/272.1, 276.1, 430/56, 496, 950, 271.1, 531

(56) References Cited

U.S. PATENT DOCUMENTS 4,035,342 A * 7/1977 Paschke .................... 260/75 R
5,308,680 A * 5/1994 Desjarlais et al. .......... 428/195
6,294,298 B1 * 9/2001 Denzinger et al. ............ 430/49
6,420,081 B1 * 7/2002 Elsasser et al. ............. 430/264

FOREIGN PATENT DOCUMENTS

| | | | | | |
|---|---|---|---|---|---|
| EP | 0 490 515 | A1 | * | 6/1992 | G03F/7/32 |
| EP | 0 690 349 | A1 | * | 1/1996 | G03F/7/06 |
| EP | 0 791 858 | A1 | * | 8/1997 | G03F/7/07 |
| EP | 1 031 881 | A1 | * | 2/2000 | G03F/7/09 |
| GB | 2 324 381 | A | * | 10/1996 | G03F/7/06 |

* cited by examiner

*Primary Examiner*—Cynthia Hamilton
(74) *Attorney, Agent, or Firm*—Leydig, Voit & Mayer, Ltd.

(57) ABSTRACT

The invention relates to a radiation-sensitive recording material for the production of offset printing plates having a dimensionally stable support, a radiation-sensitive layer located on the front of the support, and a layer which comprises an organic polymeric material having a glass transition temperature of 35° C. or above and in which pigment particles are embedded and which is resistant to processing chemicals and is located on the back of the support. The pigment particles are preferably silica gel particles having a mean diameter of from 0.1 to 50 $\mu$m or organic particles having a mean diameter of from 3 to 10 $\mu$m. The image layer on the front may be matted or pigmented. The back coating enables the recording material to be stacked without separating paper. The image layer located on the front is not scratched by the pigmented back coating during storage and transport and during removal from the stack.

24 Claims, No Drawings

PRESENSITIZED PRINTING PLATE WITH PIGMENTED BACK COATING

The present invention relates to a recording material for the production of offset printing plates having a dimensionally stable support, a radiation-sensitive layer located on the front of the support, and a layer which comprises an organic polymeric material and which is resistant to processing chemicals located on the back of the support.

Recording materials for the production of offset printing plates (also known as "presensitized printing plates") are usually supplied in stacks of 20 units or more. Extended storage times, the action of pressure and/or elevated ambient temperatures frequently result in the plates adhering to one another. On removal of individual plates from the stack, scratches may then form on the front and/or back. The problem of undesired adhesion can be substantially eliminated with the aid of separating paper. The paper is particularly necessary in the case of recording materials having an aluminium support with an uncoated back. However, the separating paper results in new problems. The recording materials are frequently produced in in-line finishing plants, in which the plates are automatically cut to the desired size and packed. The separating paper is likewise inserted automatically. However, this step is relatively slow and susceptible to faults. In addition, the paper in some cases affects the radiation-sensitive layer and adversely changes its properties. This may result in discoloration of the layer, due to a change in the pH, a drop in its light sensitivity or rapid ageing. With surface-sealed papers, the interaction between paper and radiation-sensitive layer can be reduced; however, such papers are significantly more expensive. In relatively large print shops, the plate stacks provided with separating paper are generally processed in automatic plants, with the paper usually being blown out. This operation is again relatively slow and susceptible to faults. In addition, the paper cannot be recycled and has to be disposed of.

The recording material described in JP-A 02/040657 manages without separating paper. A UV-cured layer produced from a photopolymerizable material is located on the back of its aluminium support. In addition to monomers, the composition used for the production of the back coating may also comprise photosensitizers, binders, fillers, inhibitors for preventing thermally induced polymerization of the monomers and other additives.

JP-A 06/202312 discloses a recording material for the production of offset printing plates whose aluminium support is likewise coated on the back with an organic polymer, such as polyethylene, polypropylene, polybutadiene, polyester, polycarbonate, polyvinyl acetal, polyvinyl chloride, polystyrene or a methacrylate resin. The back coating reduces attack by the aqueous-alkaline developer on the aluminium support. The light-sensitive layer in this recording material comprises from 1 to 10% by weight of a compound which is insoluble in the developer.

A recording material having an anodized aluminium support, a photopolymerizable layer on the aluminium oxide layer produced by anodization, and a back coating with a thickness of from 0.1 to 8.0 μm is disclosed in JP-A 09/265176. This coating consists of a saturated copolymerized polyester resin, a phenoxy resin, a polyvinyl acetal or a vinylidene chloride copolymer, each of which has a glass transition temperature $T_g$ of 20° C. or above. This is intended to prevent scratching of the plates during transport in the stack and delamination of the radiation-sensitive layer due to excessive adhesion to the back of the overlying plate.

A recording material for the production of offset printing plates which can be stacked without separating paper is also described in EP-A 528 395. It comprises a support (made of aluminium), a layer of an organic polymeric material having a glass transition temperature of not less than 20° C. with a thickness of from 0.01 to 8.0 μm on the back of the support, and a light-sensitive layer on the front of the support. A discontinuous matting layer consisting of particles having a mean diameter of not greater than 100 μm and a mean height of not greater than 10 μm is in turn located on the light-sensitive layer. The weight of the matting layer is from 5 to 200 mg per square meter. The matting layer enables the air between the master and light-sensitive layer in the vacuum contact copying frame to be pumped out more quickly. The matting layer can be produced, for example, by spraying-on a solution of a methyl methacrylate-ethyl acrylate-acrylic acid terpolymer, some of whose carboxyl groups are in salt form, in an electrostatic field with the aid of a spray bell rotating at about 25,000 revolutions per minute. In general, the matting layer is soluble in water or aqueous alkali. However, matting layers, in particular those comprising a material having a low glass transition temperature, tend to stick to the back of the overlying plate in the stack. This may cause relatively large areas of the radiation-sensitive layer to be delaminated, meaning that the recording material can then no longer be used further.

EP-A 490 515 relates to a presensitized printing plate which, after imagewise exposure, is developed using an aqueous alkali metal silicate solution. In order to prevent the developer from dissolving aluminium out of the back of the plate, this is provided with an organic polymeric coating which is insoluble in the developer.

The coating comprises polymers such as polyethylene, polypropylene, polybutene, polybutadiene, polyamide, polyurethane, polyurea, polyimide, polysiloxane, polycarbonate, epoxy resins, polyvinyl chloride, polyvinylidene chloride or polystyrene. It may also comprise a thermally or photochemically curing component.

DE-A 199 08 529, which is not a prior publication, proposes a recording material having a support which has on the back a layer comprising an organic polymeric material having a glass transition temperature of 45° C. or above, and a pigmented light-sensitive layer located on the front of the support. If polymers of low $T_g$ are used in the back coating, sticking to the radiation-sensitive layer of the underlying recording material may then occur.

The object was still to provide a radiation-sensitive recording material for the production of planographic printing plates which can be stacked without separating paper. The type of radiation-sensitive layer in this material should not play a particular role. It may be positive- or negative-working. Even after extended storage, even at elevated temperature, and after extended transport, it should be possible to remove the plates from the stack without damage. Sticking of the plates to one another should be reliably prevented. On development of materials having an aluminium support, the aqueous-alkaline developer should in addition only be loaded to a small extent with aluminium hydroxide. This is particularly important if a strongly alkaline developer (pH>12) is employed.

It has now been found that the said objects can be achieved by means of a recording material which has a pigmented back coating comprising an organic polymeric material having a $T_g$ of at least 35° C.

The present invention thus relates to a recording material for the production of offset printing plates having a dimensionally stable support, a radiation-sensitive layer located on the front of the support, and a layer which comprises an organic polymeric material and which is resistant to processing chemicals located on the back of the support, where the recording material is characterized in that the glass transition temperature of the organic polymeric material is 35° C. or above and that the layer located on the back is pigmented.

The layer covers the entire back of the support, i.e. forms a continuous layer. The pigment particles incorporated therein generally have a mean particle size of from 0.1 to 50.0 $\mu$m, preferably from 0.5 to 30.0 $\mu$m. The particles themselves consist of a sufficiently hard inorganic and/or organic material. Preferred pigmenting agents on use of inorganic particles or particles which consist at least of an organic core are silicic acid products having a mean particle size of from 0.5 to 20 $\mu$m and an exclusion limit of 50 $\mu$m. In a particularly preferred embodiment, the silicic acid products are combined with a surfactant, in particular a surfactant containing siloxane units. The proportion of the pigmenting particles is generally from 0.5 to 50% by weight, preferably from 2 to 30% by weight, while that of the surfactant is generally from 0.01 to 2.0% by weight, in each case based on the total weight of the non-volatile constituents of the layer. Preference is furthermore given to silicic acid products which have been hydrophobicized (for example by means of a wax) or chemically modified (for example by means of a silane). The term silicic acid products here is taken to mean synthetic silicic acids and silicates (DIN 55 921). Accordingly, both pure silicic acid ($SiO_2$) and metal oxide-containing silicic acids, such as aluminium silicates, can be used.

Silicic acid products which can be used are synthetic silicic acids and silicates in accordance with DIN 55 921. Accordingly, both pure $SiO_2$ and metal oxide-containing silicic acids are used, even though a precise distinction between the two is not possible. The term "silicic acid product" therefore comes close to the conventional term "silica", which does not or does not always distinguish between silicic acids and silicates. Silicic acid products which can be employed are, for example, ®Syloid grades from Grace, ®Silcron from Lanco, ®Gasil from Crosfield, OK/HK grades from Degussa and ®Satintone from Engelhard-Chemie.

In order to produce organic pigments, use is preferably made of wax dispersions, for example comprising polyethylene or carnauba waxes, as in commercially available paints or lattices of crosslinked polymers, for example of crosslinked polystyrene, PMMA, polybutadiene, polyethylene or polypropylene. It is likewise possible to use core-shell lattices. The mean particle size is generally between 1 and 15 $\mu$m, preferably between 3 and 10 $\mu$m.

The term "mean particle size" is taken to mean the 50% value of the cumulative weight or volume distribution curve. The 50% value of the cumulative weight distribution curve is defined as the weight that is less than that of one-half of the particles in the sample and greater than the weight of the other one-half of the particles in the sample. The 50% value of the cumulative volume distribution curve is defined as the particle volume that is less than that of one-half of the particles in the sample and greater than the volume of the other one-half of the particles in the sample. The 50% value of the cumulative volume distribution curve will correspond to the 50% value of the cumulative weight distribution curve when there is constant solid density. The exclusion limit denotes the 100% value, which is the value that is the upper limit for the range of a particular (i.e., weight or volume) value exhibited by the particles in the sample.

Various methods are available for determining the parameters, such as sedimentation measurements, image analysis of electron photomicrographs, conductivity measurements and light scattering.

The amounts of filler in the silicic acid products which are necessary for setting Bekk smoothness values of from 20 to 800 seconds, preferably from 20 to 80 seconds, vary greatly and, besides on the mean particle size, are also dependent on the layer weight and on the roughness of the layer support surface.

Hitherto, back coatings have not been pigmented since it was assumed that the relatively hard pigments scratch the front of the underlying recording material.

The radiation-sensitive layer located on the front of the support may itself be pigmented, it being possible to use pigmentation particles comprising the same or a different material than in the back coating. In an embodiment of this type, the pigmentation particles in the image layer located on the front are preferably of identical or greater hardness than those in the back coating.

The pigment particles of the back coating are generally embedded in an organic, polymeric material which is virtually insoluble in water and aqueous-alkaline developers, is physically drying and does not crosslink. Particularly suitable materials are polyolefins (such as polyethylene, polypropylene, polybutylene, polybutadiene or polyisoprene), polyesters, polycarbonates, polyamides, polysiloxanes, polystyrene, homopolymers or copolymers of or with alkyl acrylate or alkyl methacrylate units (such as polymethyl methacrylate (PMMA) or styrene-methyl methacrylate copolymers), polyvinyl acetal, phenoxy resins (for example resins made from bisphenol A and epichlorohydrin), polyvinyl chloride (PVC) or polyvinylidene chloride (PVDC). If necessary, the layer may in addition comprise additives in secondary amounts. These include, for example, plasticizers, dyes, silicone compounds or surface-active agents. In the case of physically drying, non-crosslinking back coatings, the organic polymeric material preferably has a glass transition temperature of 50° C. or above. The back coating may also be self-curing. In this case, besides the organic polymeric materials, it also comprises monomeric or oligomeric compounds which polymerize, condense or crosslink on exposure to radiation, heat and/or oxidizing agents and thus effect curing of the layer. Particularly suitable for this purpose are addition-polymerizable acrylates or methacrylates, such as ethyl (meth)acrylate, propyl (meth)acrylate, butyl (meth)acrylate, 2-hydroxyethyl (meth)acrylate, trimethylolpropane mono-, di- or tri(meth)acrylate or pentaerythritol tri(meth)acrylate. Also suitable are (meth)acrylamides, such as N-methyl-, N-ethyl-, N-propyl-, N-butyl- or N-isobutyl(meth) acrylamide; furthermore allyl esters, such as allyl acetate; vinyl ethers, such as butyl vinyl ether, octyl vinyl ether, decyl vinyl ether, 2-ethoxyethyl vinyl ether, diethylene glycol vinyl ether or benzyl vinyl ether; polyfunctional urethane acrylates which cure on exposure to UV radiation, and polyurethanes which cure on exposure to heat. In accordance with general practice, "(meth)acrylate" in the present application stands for "acrylate and/or methacrylate". A corresponding meaning applies to "(meth) acrylamide" and other derivatives of acrylic or methacrylic acid. As described, the back coating may also be light-sensitive. For distinction therefrom, the radiation hypersensitive layer on the front of the support is referred to as "image layer", since only this is exposed imagewise and developed.

The weight of the layer located on the back is generally from 1 to 20 $g/m^2$, preferably from 2 to 10 $g/m^2$.

Processes for the production of the back coating are known per se to the person skilled in the art. Particularly advantageous is production by pouring-on a liquid comprising organic polymers dissolved or dispersed under certain circumstances in organic solvents, with subsequent drying of the applied layer, optionally followed by crosslinking. However, the coating liquid can equally well be spun on or applied with the aid of knife coaters, flow coaters or other devices. It has proven advantageous to prepare the back coating first and then to produce the image layer on the front side.

The dimensionally stable, two-dimensional support can be produced from a multiplicity of materials. Suitable are, for example, supports made from plastic film (in particular polyester films, especially polyethylene terephthalate films), but preferably supports made from a metal or a metal alloy. Of these, preference is in turn given to supports made from aluminium or an aluminium alloy. The front of the aluminium support is advantageously mechanically and/or electrochemically roughened and/or anodically oxidized and, if necessary, additionally hydrophilized (for example by treatment with polyvinylphosphonic acid). In the case of anodic oxidation, the back of the aluminium support may also be coated in part or in full with an aluminium oxide layer. The continuous layer of aluminium oxide is electrically non-conducting and thus prevents the formation of local elements. This is important, for example, if the image layer contains silver halide. However, further layers between support and radiation-sensitive layer are likewise possible, for example hydrophilizing layers or priming layers. The support may also be provided with a layer of a ceramic material (additive graining). The thickness of the support is generally from 0.1 to 1.0 mm, preferably from 0.2 to 0.6 mm.

It is possible for the support provided with the back coating to be rolled up again ("coil-to-coil" process). Since the back layers are particularly stable, they are virtually undamaged in the process, even in the interior of the roll, where the greatest forces act.

Depending on the nature of their composition, the image layer may be sensitive to UV radiation, visible light and/or IR radiation or heat.

The radiation-sensitive component in the image layer may, for example, be a diazonium salt, a combination of a photopolymerization initiator and a polymerizable monomer (in particular a monomer containing a polymerizable ethylenically unsaturated group), a combination of a compound which forms acid on irradiation, and a compound which can be cleaved by the photochemically generated acid.

Use is particularly frequently made in positive-working image layers of esters of a 1,2-naphthoquinone-2-diazido-4- or -5-sulphonic acid and a compound containing at least one phenolic hydroxyl group. The last-mentioned compound preferably has at least 3 phenolic hydroxyl groups. Very particular preference is given for the esterification to compounds containing from 3 to 6 phenolic hydroxyl groups. Examples thereof are 2,3,4-trihydroxybenzophenone, 2,3,4-trihydroxy-3'-methyl-, -propyl- or -isopropylbenzophenone, 2,3,4,4'-tetrahydroxybenzophenone, 2,3,4,2',4'-pentahydroxybenzophenone, 2,3,4,2',3',4'-hexahydroxybenzophenone and 5,5'-diacyl-2,3,4,2',3',4'-hexahydroxydiphenyl-methane. In general, not all the phenolic hydroxyl groups therein are esterified. The degree of esterification, based on all hydroxyl groups, is typically from 60 to 95%. Amides of 1,2-naphthoquinone-2-diazido-4- or -5-sulphonic acid are likewise suitable. Esterification components which can be used are also products of the condensation of pyrogallol and aldehydes or ketones and products of the condensation of alkylated phenol and formaldehyde. The content of radiation-sensitive compounds is from about 1 to 50% by weight, based on the total weight of the non-volatile constituents of the mixture. Image layers comprising naphthoquinonediazidosulphonic acid esters or -sulphonamides as radiation-sensitive component are particularly sensitive to UV and visible light.

Positive-working image layers which are insensitive to UV radiation and visible light, but can be imaged by IR or heat radiation are likewise known (EP-A 900 653). The layer comprises, as radiation hypersensitive components, carbon black particles or a dye in disperse form which is sensitive in the IR region. IR radiation, in particular IR laser radiation, effects imagewise differentiation in the layer, enabling the irradiated areas to be removed by a developer.

It is also possible to use recording materials having a positive-working image layer which comprises a combination of a compound containing at least one C—O—C bond which can be broken by acid and a compound which forms a strong acid on exposure to actinic radiation. Layers of this type are known to the person skilled in the art and are described in large number, for example EP-A 717 317.

Besides a polymeric binder, photopolymerizable image layers usually comprise a free-radical-polymerizable component (monomer) and an initiator which is capable of initiating polymerization of the monomer on exposure to actinic radiation. The initiator is, for example, a combination of a photoreducible dye and a metallocene, in particular a titanocene. The monomers frequently contain free-radical-polymerizable acrylate or methacrylate groups. The light sensitivity of such layers can be increased still further by employing monomers containing at least one photooxidizable group or additionally onium compounds, in particular iodonium or sulphonium salts. Photopolymerizable layers are impaired by atmospheric oxygen. They are therefore often protected by a cover layer which is relatively impermeable to oxygen, but which can be removed completely again by aqueous developers.

The image layer may also comprise silver halide as radiation-sensitive component. It then includes a silver halide emulsion layer. Preference is given to image layers which work by the silver complex diffusion transfer reversal process (abbreviated to DTR process). It then consists of two or more part layers, as described in greater detail in EP-A 410 500, 423 399 or 883 027. The lowermost, i.e. closest to the support, is usually a receiving layer comprising silver nuclei. The nuclei initiate the development of the silver complexes that have diffused in, giving a silver image when a suitable developer acts thereon. The development nuclei are preferably produced by application of colloidal silver, gold, platinum, palladium or other metals. They may furthermore consist of heavy-metal sulphides or selenides, for example sulphides of antimony, bismuth, cadmium, cobalt, lead, nickel, palladium, platinum, silver or zinc. Palladium sulphide and the nickel/silver sulphide $NiS.Ag_2S$ described in U.S. Pat. No. 4,563,410 are particularly suitable. Also suitable are polyselenides or polysulphides of heavy metals. In addition, dyes or pigments may be present as antihalo agents, either as a constituent of the nucleus layer or in a separate layer. The type of dye or pigment depends on the region of the spectrum in which the silver halide emulsion layer is sensitive. The nucleus layer is very thin (generally less than 0.5 $\mu$m); it normally contains no binder. As already described, the nucleus layer is not absolutely necessary. If no such layer is present, constituents of the metallic support take on the role of the development nuclei. Finally, it is also possible to arrange the image receiving layer or nucleus layer on a separate support. DTR materials of this type consisting of two elements are known in principle.

A thin, silver-free interlayer, for example a layer of pigment and a hydrophilic, film-forming polymer, for example polyvinyl alcohol or pullulane, is located above the receiving layer. The next is a silver halide emulsion layer. The silver halide is, for example, silver chloride, bromide, bromoiodide, chlorobromoiodide or a mixture thereof. The silver halide advantageously comprises more than 90% by weight, based on the total weight of the silver halides, of silver chloride. In addition, small amounts of silver chloroiodide and/or silver bromide are frequently also present. The silver halide particles in the emulsion layer normally have a mean size of from 0.05 to 1.0 μm, preferably from 0.25 to 0.45 μm. They can also be produced by the core of the particles having a different composition than the shell. Silver bromide is frequently located exclusively in the core. The binders used for this layer are generally hydrophilic colloids, preferably gelatin. The gelatin is advantageously not hardened. Instead of or in addition to the gelatin, it is also possible to employ other polymers, for example polyvinyl alcohol, polyvinylpyrrolidone, polyvinylimidazole, poly(meth)acrylamide, polyacrylic acid, cellulose or cellulose derivatives (particularly cellulose ethers, such as hydroxyalkyl- or carboxymethylcellulose), starch or alginates. Finally, the emulsion layer may also comprise dyes in order to adjust the spectral sensitivity of the silver halide layer and/or in order to prevent undesired light scattering. These are, for example, methine, cyanine or hemicyanine dyes. Finally, the silver halide layer may comprise conventional emulsion stabilizers, for example azaindenes, especially tetra- or pentaazaindenes. The azaindenes are preferably substituted by amino or hydroxyl groups. An example of a substituted azaindene of this type is 4-hydroxy-6-methyl-1,3,3a,7-tetraazaindene. Other suitable stabilizers are quaternized benzothiazoles, benzotriazoles and heterocyclic mercapto compounds, for example mercapto-substituted tetraazoles and pyrimidines. An example of a tetraazole of this type is 1-[3-(2-sulphobenzoylamino)phenyl]-5-mercaptotetraazole.

In a preferred embodiment, a protective layer may also be located on the silver halide emulsion layer. It generally has a weight of from 0.50 to 1.75 g/m$^2$, preferably from 0.60 to 1.20 g/m$^2$ and advantageously consists of unhardened gelatin (a 10% strength by weight aqueous solution of the gelatin has a viscosity of preferably less than 20 mPa.s at 40° C. and at pH 6). The cover layer may in turn comprise dyes and/or coloured pigments and/or matting agents. The matting agent here generally consists of particles having a mean diameter of from 0.2 to 10 μm, preferably from 0.5 to 6.0 μm.

Negative-working layers which are provided for imaging with UV or visible light in many cases comprise diazonium salt polycondensation products. These are, in particular, products of the condensation of aromatic diazonium salts. Condensation products of this type are known, inter alia, from DE-A 12 14 086 (=U.S. Pat. No. 3,235,384). They are generally prepared by condensation of a polycyclic aromatic diazonium compound, preferably of substituted or unsubstituted diphenylamine-4-diazonium salts with active carbonyl compounds, preferably formaldehyde, in a strongly acidic medium, preferably concentrated phosphoric acid.

The image layer may also be imaged by an electrophotographic principle. In this case, it usually comprises a photoconductive layer comprising an organic photoconductor on an electrically conductive support.

In addition to the radiation hypersensitive component, the image layer usually also comprises a polymeric, organic binder. Preference is given to phenolformaldehyde condensates, where the term "phenol" here is also taken to mean substituted phenols, such as resorcinol, cresol, xylenol, and the like. Besides or in addition to the formaldehyde, it is also possible to employ other aldehydes or also ketones as condensation partner. Also suitable are products of the reaction of diisocyanates with diols or diamines, in particular those containing groups. Mention should also be made of polymers containing units of vinylaromatic compounds, N-aryl(meth)acrylamides or aryl (meth)acrylates, where these units in each case also contain one or more carboxyl group(s), phenolic hydroxyl groups, sulphamoyl or carbamoyl groups.

If the recording material according to the invention is pigmented or matted on the front, the Bekk smoothness of the surface on this side is generally less than 600 s, preferably from 40 to 150 s.

The further processing (imagewise exposure or irradiation, development, etc.) for the recording materials according to the invention is carried out virtually in the same way as for recording materials without back coatings. Since the back coating is resistant to processing chemicals, it also prevents attack by the developer on the support. This is particularly important in the case of aluminium supports. These are attacked by alkaline developers, in particular by strongly alkaline developers, which increases the developer load and thus reduces its service life.

The following examples serve to illustrate the invention. pbw therein stands for part(s) by weight. Percentages are percent by weight, unless otherwise stated.

EXAMPLES

One of the following solutions was applied to an aluminium foil with a thickness of 300 μm which had been roughened in HCl (roughness value in accordance with DIN 4768 5.0 μm), subjected to interim pickling in sulphuric acid and anodized (oxide weight 4.0 g/m$^2$) and hydrophilized using polyvinylphosphonic acid:

Comparative Examples

Back Coatings (R):

| | | |
|---|---|---|
| R1 | 10 pbw | of a styrene-methyl methacrylate copolymer having a $T_g$ of 54° C., |
| | to 100 pbw | butan-2-one (= methyl ethyl ketone). |
| R2 | 10 pbw | of a poly-n-propyl methacrylate having a $T_g$ of 35° C., |
| | to 100 pbw | butan-2-one. |
| R3 | 10 pbw | of a UV coating consisting of: |
| | 90 pbw | of a hexafunctional urethane acrylate (CN-975 from Sartomer), |
| | 5 pbw | of an α-hydroxyketone (®Esacure KIP 100 F from Sartomer), |
| | 2 pbw | of methyldiethanolamine, |
| | 3 pbw | of benzophenone. |

The coating is cured by exposure for one minute with a UV lamp (120 W) at a wavelength of 254 nm.

| | | |
|---|---|---|
| R4 | 10 pbw | of a thermally crosslinking polyurethane (®Desmotherm 2170 from Bayer AG) |

The coating is thermally crosslinked for 30 seconds at a peak metal temperature of 230° C. and thus cured.

Examples

As pigment (P), a silica gel filler was added to the back coatings R1 to R4 in the following amounts and with various mean particle sizes:

| | | |
|---|---|---|
| R1P = | 0.5 pbw of silica gel filler having a mean particle size of 4 μm, | |
| R2P = | 2.0 pbw of silica gel filler having a mean particle size of 3 μm, | |
| R2Pb = | R2P + 2.0 pbw of a 40% strength polyethylene wax dispersion in ethanol having a mean particle size of 10 μm and an exclusion size of 15 μm, | |
| R3P = | 0.5 pbw of silica gel filler having a mean particle size of 1 μm, | |
| R4P = | 5.0 pbw of silica gel filler having a mean particle size of 10 μm. | |

Front Coatings (F):

(P=positive-working coating, N=negative-working, T=thermally imageable, A=silver halide (AgX) containing and E=electrophotographic)

| | | |
|---|---|---|
| P1 | 7.8 pbw | of a cresol-formaldehyde novolak having a hydroxyl number of 420 in accordance with DIN 53783/53240 and a mean molecular weight by GPC of 6000 (polystyrene standard), |
| | 3.2 pbw | of a product of the esterification of 1.5 mol of 1,2-naphthoquinone-2-diazido-5-sulphonyl chloride and 1 mol of 2,3,4-trihydrobenzophenone, |
| | 0.4 pbw | of 1,2-naphthoquinone-2-diazido-5-sulphonyl chloride, |
| | 0.2 pbw | of Victoria Pure Blue (C.I. 44045), |
| | to 100 pbw | a mixture of tetrahydrofuran and 1-methoxypropan-2-ol (50:50) |
| P2 | | corresponded to P1, with a difference that 0.1 pbw of a silica gel filler having a mean particle size of 4 μm had been added. |
| P3 | 4.5 pbw | of a product of the esterification of 1,2-diazo-naphthoquinone-5-sulphonyl chloride and a pyrogallol-acetone resin (see Example 1 of US-A 3,636,709), |
| | 11 pbw | of a cresol-formaldehyde novolak, |
| | 0.2 pbw | of 2-(p-methoxyphenyl)-4,6-bis(trichloromethyl)-s-triazine, |
| | 0.1 pbw | of Oil Blue # 603 (Orient Chemical Industries Co. Ltd.), |
| | 0.04 pbw | of surfactant (®Megafac F-177 from Dainippon Ink and Chemicals), |
| | 100 pbw | of butan-2-one, |
| | 100 pbw | of propylene glycol monomethyl ether. |

P1 to P3 were dried at 100° C. for 1 minute. The layer weight was in each case 2.0 g/m$^2$.

A matting layer was subsequently applied to layer P3:

To this end, an MMA-ethyl acrylate-acrylic acid copolymer (weight ratio of the monomer units 65:20:15) which had been partially neutralized and was accordingly in the form of the sodium, potassium or ammonium salt was dissolved in water to give a 12% strength solution. This solution was applied using an electrostatic spray device (25,000 revolutions of the spray head per minute). 40 ml/min were sprayed. The electrostatic potential at the spray head was −90 kV, and the spray process took place at 25° C. and 50% atmospheric humidity. 2.5 seconds after spraying with the copolymer solution, the copy layer was sprayed with steam and subsequently dried for 5 seconds using hot air (60° C., 10% relative atmospheric humidity). This gave a matting layer which had elevations with a mean height of 6 μm and a mean diameter of 30 μm. The mean weight of the matting layer was 0.15 g/m$^2$.

P4 Firstly, a positive-working radiation-sensitive layer was produced. To this end, the coating solution also applied to P1 was used. The layer weight after drying was 1.9 g/m$^2$. A matting layer was then applied to this layer as follows:

Firstly, a 35% strength solution of a cresol-formaldehyde novolak in ethylene glycol ethyl ether acetate (=2-ethoxyethanol acetate) was prepared. The solution had a conductivity of 1.2×10$^7$ pSm$^{-1}$. The solution was introduced into an electrostatic spray device provided with a capillary. The capillary had an electrostatic potential of −30 kV. It was located 30 cm above the surface to be coated. The electrostatic spray coating was carried out at a temperature of 30° C. and a spray rate of 0.70 cm$^3$/min. In this way, a discontinuous matting layer was obtained whose individual particles had a diameter of from about 30 to 40 μm and did not penetrate through the radiation-sensitive layer.

| | | |
|---|---|---|
| P5 | 4.70 pbw | of a cresol-formaldehyde novolak having a hydroxyl number of 420 in accordance with DIN 53783/53240 and a mean molecular weight by GPC of 6000 (polystyrene standard), |
| | 1.90 pbw | of a polyacetal made from 2-ethylbutyraldehyde and trimethylene glycol, |
| | 0.23 pbw | of 2-(4-styrylphenyl)-4,6-bistrichloromethyl-s-triazine, |
| | 0.02 pbw | of Crystal Violet, |
| | 0.10 pbw | of a silica gel filler having a mean particle size of 4 μm, |
| | to 100 pbw | a mixture of butan-2-one and ethylene glycol monomethyl ether (90:10). |

After drying, the layer weight was 1.9 g/m$^2$.

| | | |
|---|---|---|
| N1 | 62.00 pbw | of a maleic anhydride-functionalized polyvinylbutyral having a molecular weight $M_w$ = about 80,000 which contains 71% of vinylbutyral, 2% of vinyl acetate and 27% of vinyl alcohol units, |
| | 21.00 pbw | of a diazonium salt polycondensation product prepared from 1 mol of 3-methoxydiphenylamine-4-diazonium sulphate and a 4,4'-bis-methoxymethyl-diphenyl ether in 85% strength phosphoric acid, isolated as mesitylene sulphonate, |
| | 2.50 pbw | of phosphoric acid, |
| | 3.00 pbw | of Victoria Pure Blue FGA (C.I. Basic Blue 81), |
| | 0.70 pbw | of phenylazodiphenylamine, |
| | 2570 pbw | of ethylene glycol monomethyl ether and |
| | 780 pbw | of butyl-2-one. |
| N2 | | as N1, but in addition 0.10 pbw of a silica gel filler having a mean particle size of 3 μm, |
| N3 | | as N1, but with an additionally applied matting layer, where the matting layer corresponded to that applied to layer P3. |

The layer weight of N1 to N3 was in each case 0.9 g/m$^2$ (in the case of layer N3 before application of the matting layer).

| | | |
|---|---|---|
| N4 | 4.50 pbw | of a copolymer of maleic anhydride and methyl methacrylate having an acid number of from 100 to 120 and a mean molecular weight $M_w$ = 100,000, |
| | 2.00 pbw | of a urethane acrylate (®Plex 6661 from Röhm AG), |

-continued

| | |
|---|---|
| 3.00 pbw | of a product of the reaction of 1 mol of hexamethylenediamine with 2 mol of hydroxyethyl methacrylate, |
| 0.35 pbw | of phenylacridine, |
| 0.10 pbw | of Leuko Crystal Violet, |
| 0.05 pbw | of Crystal Violet, |
| to 100.00 pbw | a mixture of propylene glycol monomethyl ether ( ®Dowanol) and butan-2-one (70:30). |

After drying, the layer weight was 1.0 g/m$^2$. A water-soluble cover layer was applied to this radiation-sensitive layer. To this end, the following coating solution was used:

| | |
|---|---|
| 7.00 pbw | of a polyvinyl alcohol containing 12% of acetate groups, |
| 0.01 pbw | of a fatty alcohol ethoxylate having 8 ethylene oxide units, |
| to 100.00 pbw | water. |

The weight of the cover layer after drying was 2.0 g/m$^2$.

| | | |
|---|---|---|
| T1 | 9.70 pbw | of a cresol-formaldehyde novolak having a hydroxy number of 420 in accordance with DIN 53783/53240 and a mean molecular weight by GPC of 6000 (polystyrene standard), |
| | 0.80 pbw | of poly(4-hydroxystyrene) having an $M_w$ of from 4000 to 6000 and an $M_n$ of from 2100 to 3100 ( ®Maruka Lyncur M, grade S2 from Matruzen Petrochemical Co., Ltd.), |
| | 8.00 pbw | of a carbon black dispersion, |
| | 40.00 pbw | of propylene glycol monomethyl ether, |
| | 31.00 pbw | of acetone and |
| | 10.50 pbw | of γ-butyrolactone. |

The carbon black dispersion comprised

| | |
|---|---|
| 5.00 pbw | of carbon black (special black from Degussa AG), |
| 66.00 pbw | of the above-described novolak (30% strength in γ-butyrolactone), |
| 28.99 pbw | of γ-butyrolactone and |
| 0.01 pbw | of silicone antifoam (RC31 from Agfa-Gevaert AG). |

A1 Firstly, a nucleus layer comprising 2.3 mg of silver nuclei (prepared from colloidal silver) was produced.

An interlayer comprising a mixture of binder (pullulane) and coloured pigment (®Levanyl Red dispersion) was applied to this nucleus layer. The interlayer comprised 0.1 g/m$^2$ of pullulan and 0.2 g/m$^2$ of Levanyl Red dispersion.

An unhardened, negative-working, cadmium-free gelatin/silver chloroiodide emulsion (weight ratio 99.75:0.25) was then applied to the interlayer. This layer furthermore comprised 1 mmol of 4-hydroxy-6-methyl-1,3,3a,7-tetraazaindene and 2.2 mmol of 1-[3-(2-sulfobenzoylamino)phenyl]-5-mercaptotetrazole per mole of AgX. The silver halide was applied in an amount which corresponded to 2.4 g/m$^2$ of silver nitrate. The gelatin was applied in an amount of 1.6 g/m$^2$. The gelatin comprised two different types, one of which had a viscosity of 21 mPa.s (0.7 g/m$^2$) and the other had a viscosity of 14 mPa.s (0.9 g/m$^2$).

Finally, a cover layer comprising 0.7 g/m$^2$ of gelatin having a viscosity of between 10 and 12 mPa.s, 0.1 g/m$^2$ of Levanyl Red dispersion and 0.12 g/m$^2$ of a matting agent having a particle diameter of 7.5 μm was applied to the silver halide emulsion layer.

| | | |
|---|---|---|
| E1 | 6.50 pbw | of styrene/MA copolymer (styrene/MA = 1.4) having a mean molecular weight $M_w$ of 100,000, |
| | 4.00 pbw | of 2,5-bis(4-diethylaminophenyl)-1,3,4-oxadiazole, |
| | 0.02 pbw | of Rhodamine FB (C.I. 45170) and |
| | 0.02 pbw | of acriflavin in |
| | 45.00 pbw | of acetone and |
| | 45.00 pbw | of γ-butyrolactone. |

In none of the examples were the copying properties of the plates worse than those of corresponding plates without a back coating.

Test 1

The proportion of pigmenting agent was selected so that the back coating had a Bekk smoothness of from 20 to 800 s, preferably from 20 to 80 s. The Bekk smoothness was determined in accordance with DIN 53 107, method A, in which the time was measured in which the pressure in the vacuum vessel increased from −507 mbar to −489 mbar for the measurement sample as a consequence of the volume of air sucked through.

| | |
|---|---|
| n.a. = | not applicable (no vacuum aid or not measurable since excessive layer delamination) |
| − = | change due to storage >30% |
| 0 = | change due to storage 20–30% |
| + = | change due to storage 10–20% |
| ++ = | change due to storage 0–10% |

Test 2

Appearance after storage under the influence of relatively high weights (conditions: stack with 100 600×800 mm plates with additional weighting of 50 kg for 2 weeks at 50° C. and 50% relative atmospheric humidity)

| | |
|---|---|
| −− = | large-area layer delamination due to sticking |
| − = | partial layer delamination |
| 0 = | pinholes due to incipient sticking or change in the visual appearance due to diffusion processes at >10% |
| + = | substantial layer retention |
| ++ = | virtually no layer delamination − flaw <3%. |

Test 3

Lifting of the stack with grippers of a commercially available automatic processing plant after storage. Assessment through percentage of flaws on lifting 500 plates

| | |
|---|---|
| −− = | >10% |
| − = | up to 10% |
| 0 = | up to 5% |
| + = | up to 2% |
| ++ = | no flaws |

The test results for different front and back coatings are shown in the following table. For comparative purposes, the results of the investigation of recording materials with a non-pigmented back are also included therein.

| | | Back | | | | | | | | |
|---|---|---|---|---|---|---|---|---|---|---|
| Front | Test | R1 | R1P | R2 | R2P | R2Pb | R3 | R3P | R4 | R4P |
| P1 | 1 | n.a. | n.a. | | n.a. | | | | | |
| | 2 | 0 | + | | + | | | | | |
| | 3 | − | + | | + | | | | | |
| P2 | 1 | | ++ | n.a. | ++ | ++ | | | 0 | ++ |
| | 2 | | ++ | − | ++ | ++ | | | 0/+ | ++ |
| | 3 | | ++ | − | ++ | ++ | | | + | ++ |
| P3 | 1 | 0 | + | n.a. | + | | | | | + |
| | 2 | | + | − | + | | | | | + |
| | 3 | | + | − | + | | | | | + |
| P4 | 1 | | + | n.a. | + | | | | 0 | + |
| | 2 | | + | − | + | | | | | + |
| | 3 | | + | − | + | | | | | + |
| P5 | 1 | | | | | | 0 | ++ | | |
| | 2 | | | | | | 0/+ | ++ | | |
| | 3 | | | | | | + | ++ | | |
| N1 | 1 | n.a. | n.a. | n.a. | n.a. | | | | | |
| | 2 | 0 | + | − | + | | | | | |
| | 3 | − | + | − | + | | | | | |
| N2 | 1 | | ++ | | ++ | ++ | | | 0 | ++ |
| | 2 | | ++ | | ++ | ++ | | | 0/+ | ++ |
| | 3 | | ++ | | ++ | ++ | | | + | ++ |
| N3 | 1 | 0 | + | n.a. | + | | | | | + |
| | 2 | | + | − | + | | | | | + |
| | 3 | | + | − | + | | | | | + |
| N4 | 1 | | | | n.a. | | n.a. | n.a. | | n.a. |
| | 2 | | | | + | | 0 | + | | + |
| | 3 | | | | ++ | | − | + | | ++ |
| T1 | 1 | | n.a. | | | n.a. | | n.a. | n.a. | n.a. |
| | 2 | | + | | | + | | + | 0 | + |
| | 3 | | ++ | | | ++ | | + | − | ++ |
| A1 | 1 | n.a | n.a. | | | | | n.a. | | n.a. |
| | 2 | 0 | + | | | | | + | | + |
| | 3 | − | ++ | | | | | + | | ++ |
| E1 | 1 | n.a. | | n.a. | | | | | | |
| | 2 | 0 | | + | | | | | | |
| | 3 | − | | ++ | | | | | | |

For key, see under Test 1 to Test 3

What is claimed is:

1. A recording material for the production of offset printing plates comprising a dimensionally stable support, a radiation-sensitive layer located on the front of the support, and a back coating which comprises an organic polymeric material located on the back of the support, wherein the glass transition temperature of the organic polymeric material is 35° C. or above, and the back coating comprises from 0.5 to 50% by weight of a pigment and is resistant to processing chemicals.

2. The recording material according to claim 1, wherein the back of the support the back coating is a continuous layer.

3. The recording material according to claim 1, wherein the organic polymeric material is a material which dries physically, but does not crosslink at the same time.

4. The recording material according to claim 3, wherein the organic polymeric material has a glass transition temperature of at least 50° C.

5. The recording material according to claim 1, wherein the organic polymeric material crosslinks on thermal or photochemical induction.

6. The recording material according to claim 1, wherein the pigment comprises particles having a mean particle size of from 0.1 to 50.0 μm.

7. The recording material according to claim 6, wherein the particles have a mean particle size of from 0.5 to 20.0 μm.

8. The recording material according to claim 1, wherein the pigments comprise particles selected from the group consisting of inorganic materials, particles having at least a core of inorganic material and mixtures thereof.

9. The recording material according to claim 8, wherein the particles consist essentially of a silicic acid product.

10. The recording material according to claim 9, wherein the silicic acid product is further combined with a surfactant.

11. The recording material according to claim 1, wherein the pigments comprise particles which consist essentially of an organic material.

12. The recording material according to claim 11, wherein the particles consist essentially of a wax.

13. The recording material according to claim 11, wherein the particles consist essentially of a crosslinked polymer latex.

14. The recording material according to claim 1, wherein the back coating further comprises plasticizers.

15. The recording material according to claim 14, the back coating further comprising a dye.

16. The recording material according to claim 1, wherein the back coating has a Bekk smoothness of from 20 to 800 s.

17. The recording material according to claim 16, wherein back coating has a Bekk smoothness of from 20 to 80 s.

18. The recording material according to claim 1, wherein the back coating has a weight of from 1 to 20 $g/m^2$.

19. The recording material according to claim 18, wherein back of the support back coating has a weight of from 2 to 10 $g/m^2$.

20. The recording material according to claim 1, wherein the radiation-sensitive layer located on the front of the support is colored.

21. The recording material according to claim 20, wherein the surface of the radiation-sensitive layer located on the front of the support has a Bekk smoothness less than 600 s.

22. The recording material according to claim 21, wherein the surface of the radiation-sensitive layer located on the front of the support has a Bekk smoothness of from 40 to 150 s.

23. The recording material according to claim 1, wherein the radiation-sensitive layer located on the front of the support is matted.

24. The recording material according to claim 20, wherein the radiation-sensitive layer located in the front of the support further comprising a pigment.

* * * * *